(12) United States Patent
Williamson et al.

(10) Patent No.: US 9,281,269 B2
(45) Date of Patent: Mar. 8, 2016

(54) INTEGRATED CIRCUIT PACKAGE AND METHOD OF MANUFACTURE

(71) Applicant: Texas Instruments Incorporated, Dallas, TX (US)

(72) Inventors: Jaimal Mallory Williamson, McKinney, TX (US); Nima Shahidi, Dallas, TX (US); Yaoyu Pang, Houston, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 265 days.

(21) Appl. No.: 13/682,576

(22) Filed: Nov. 20, 2012

(65) Prior Publication Data

US 2014/0138822 A1   May 22, 2014

(51) Int. Cl.
*H01L 23/48* (2006.01)
*H01L 23/498* (2006.01)

(52) U.S. Cl.
CPC .... *H01L 23/49816* (2013.01); *H01L 23/49822* (2013.01); *H01L 23/49827* (2013.01); *H01L 2224/131* (2013.01); *H01L 2224/16225* (2013.01); *H01L 2224/8121* (2013.01); *H01L 2224/8123* (2013.01); *H01L 2224/81815* (2013.01); *H01L 2924/15311* (2013.01); *H01L 2924/3511* (2013.01)

(58) Field of Classification Search
CPC .................................................... H01L 23/48
USPC .................. 257/675, 698, 724, 738
See application file for complete search history.

(56) References Cited

U.S. PATENT DOCUMENTS

| 5,641,995 A | 6/1997 | Sloma et al. |
| 2013/0010432 A1* | 1/2013 | Sundstrom et al. ........... 361/748 |

* cited by examiner

*Primary Examiner* — Marvin Payen
(74) *Attorney, Agent, or Firm* — Steven A. Shaw; Frank D. Cimino

(57) ABSTRACT

An integrated circuit (IC) package, device, including a substrate having a top surface with an IC die mounting area and a peripheral area surrounding the mounting area, a plurality of parallel conductor layers, a plurality of insulating layers and a plurality of plated through holes (PTHs) extending through the conductor layers and insulating layers. Various substrate structures in which certain of the PTHs and/or conductor layers and/or insulating layers have different CTE's than the others is disclosed. The various structures may reduce circuit failures due to substrate warpage and/or solder joint damage associated with a CTE mismatch between the substrate and the IC die.

10 Claims, 3 Drawing Sheets

INTEGRATED CIRCUIT PACKAGE AND METHOD OF MANUFACTURE

BACKGROUND

The term "flip chip" denotes a method for interconnecting semiconductor devices, such as integrated circuit (IC) chips, to external circuitry with solder bumps that have been deposited onto the chip pads. IC dies having such solder bumps are referred to as "flip chips." The solder bumps are typically deposited on the chip pads on the top side of a wafer during the final wafer processing step. In order to mount the chip to external circuitry, it is "flipped" over so that its top side faces down, and is positioned so that its pads align with matching pads on the external circuit. Then the solder in the solder bumps is flowed to complete the interconnect. After solder bonding is completed, a material known as underfill is applied to fill in the open spaces between solder bumps. The underfill is then heated to bond it to adjacent structure. The underfill provides added support to the bumps and helps to absorb stresses that might otherwise cause the solder bonds to fracture.

A flip chip may, in the manner discussed above, be attached directly to a printed circuit board. In some situations, the size and/or spacing of the flip chip solder bumps are different than those of the pads on the printed circuit board to which it is to be attached. In such situations, the flip chip may be provided in an integrated circuit (IC) package by mounting it on a chip carrier which is then directly attached to the printed circuit board. One type of chip carrier that is frequently used with a flip chip is known as ball grid array (BGA) carrier because it has a grid of solder balls on its bottom surface. An IC package having a flip chip operably mounted on the top surface of a ball grid array carrier is referred to as a flip chip ball grid array (FCBGA) package. In such a package the solder ball array on the carrier is usually considerably larger in scale than the solder bump grid on a flip chip, but each may contain the same number of contacts. An FCBGA package may be attached to a substrate in a manner analogous to that of flip chip attachment. The solder balls on the bottom of the FCBGA package are placed in contact with corresponding contact pads on the top surface of the substrate. The assembly is then heated, as in a reflow oven, to bond the solder balls to the contact pads. After solder bonding underfill material is applied between the solder balls and the assembly is reheated to bond the underfill to the package, substrate and adjacent portions of the solder balls.

Other types of flip chip packages include flip chip/pin grid array packages, column grid array packages, land grid array packages, and package on package packages. A flip chip may be connected to various types of electrical substrates (e.g., a printed circuit board, a chip carrier in an IC package, or other electrical substrate, all of which are referred to generically herein as "substrate")

Electrical substrates may be made from different substances depending upon their intended use. Some electrical substrates are made from organic/plastic material and are known as organic or plastic substrates. Such substrates generally have copper pads in a pattern on the top surface of the substrate that matches the pattern of solder balls on a flip chip that is to be mounted on it. The flip chip is placed on the substrate, as with a pick and place machine, with solder bumps on the flip chip contacting corresponding pads on the substrate. The assembly is then heated, e.g., either in a reflow oven or by an infrared heater, causing the solder balls to liquefy or "flow." Thereafter, the solder cools and solidifies, physically and electrically connecting the flip chip to the substrate.

One disadvantage associated with flip chips is that the solder bumps cannot flex in the way that longer leads can because the solder bumps are compact and not compliant. Bending during flip chip assembly and thermal cycling caused by a difference in coefficient of thermal expansion (CTE) between the organic substrate and the silicon flip chip can cause the organic substrate to warp. Such bending may also cause the underfill to delaminate from the substrate, which may lead to fractures in adjacent solder bonds.

BRIEF DESCRIPTION OF THE DRAWINGS

FIG. 4 is a cross sectional view of a plated through hole taken along the line 4-4 in FIG. 3.

DETAILED DESCRIPTION

Figure 1:
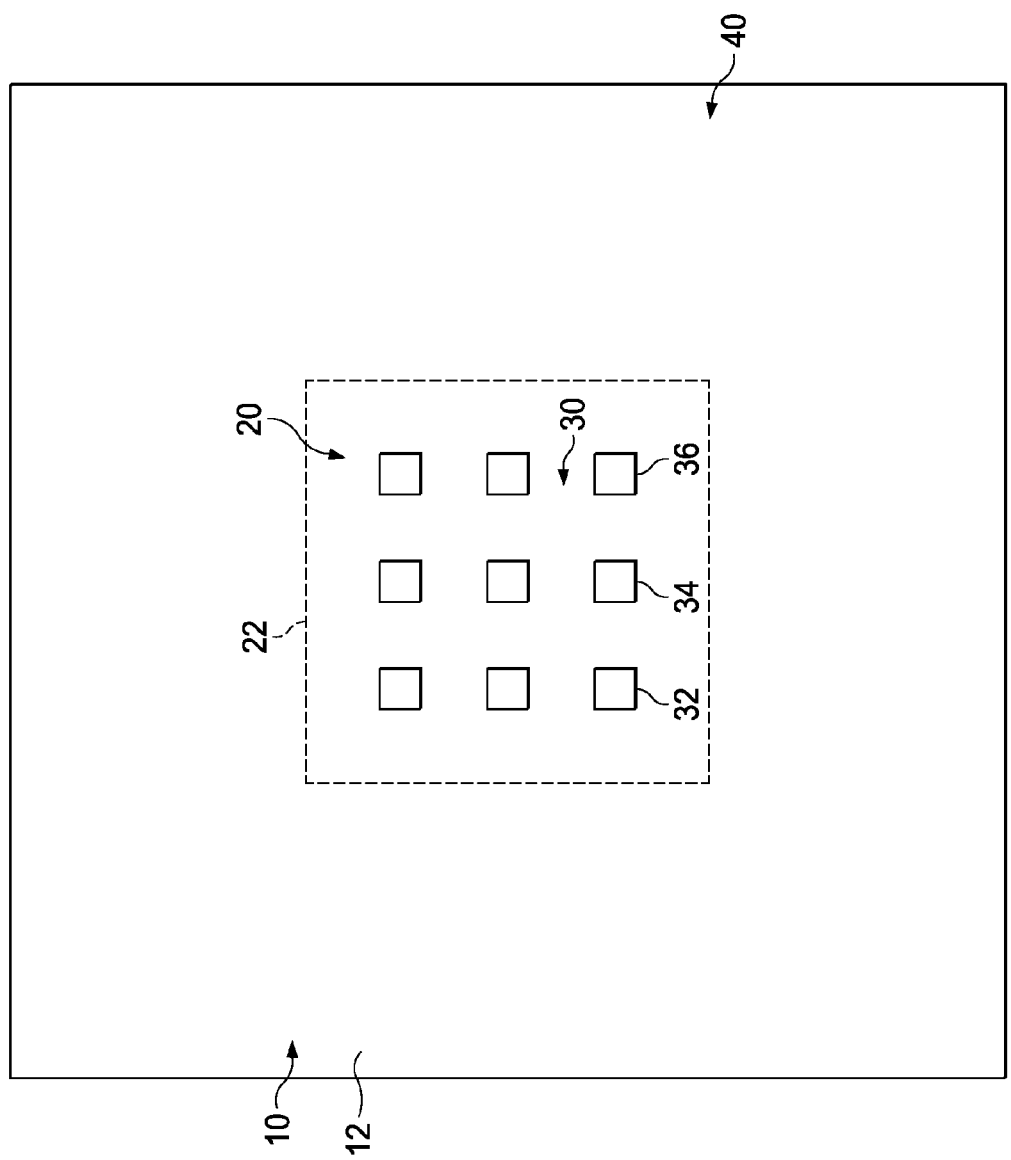
FIG. 1 is a schematic top plan view of a substrate having a die mounting area thereon.

FIG. 1 schematically illustrates an organic (plastic) electrical substrate 10 such as a printed circuit board or chip carrier which may be used to connect a semiconductor device, e.g., a silicon die integrated circuit device, to external circuitry. As used herein, the term "substrate" means printed circuit board or chip carrier or other electrical substrate to which a semiconductor device may be directly connected. With reference to FIG. 1, the substrate 10 may include an upper surface 12 and an oppositely disposed lower surface 14 (FIG. 3). With continued reference to FIG. 1, a die mounting area 20 may be formed on the upper surface 12, as shown. The die mounting area 20 may include a plurality of electrically conductive lands 30, including the individual lands 32, 34, and 36, to facilitate electrical connection between the substrate 10 and the semiconductor device (e.g., the silicon die integrated circuit device 50, FIGS. 2-3) which will be mounted in the die mounting area 20. The upper surface 12 of the substrate 10 may also include a peripheral area 40 surrounding the die mounting area 20. The boundary between the die mounting area 20 and the peripheral area 40 is schematically indicated in FIG. 1 by the dashed line 22.

Figure 2:
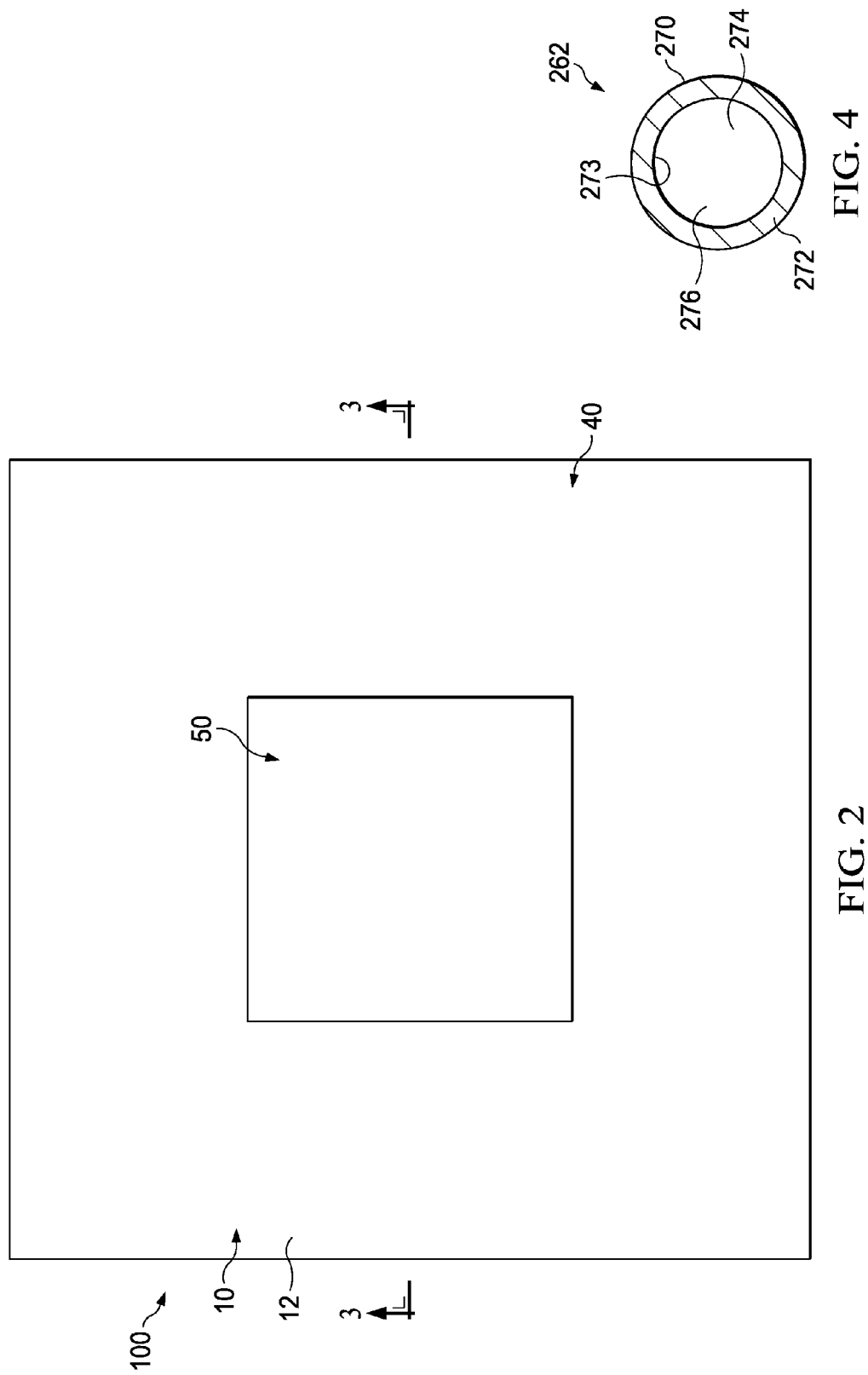
FIG. 2 is a schematic top plan view of the substrate of FIG. 1 having a die mounted within the die mounting area.
Figure 3:
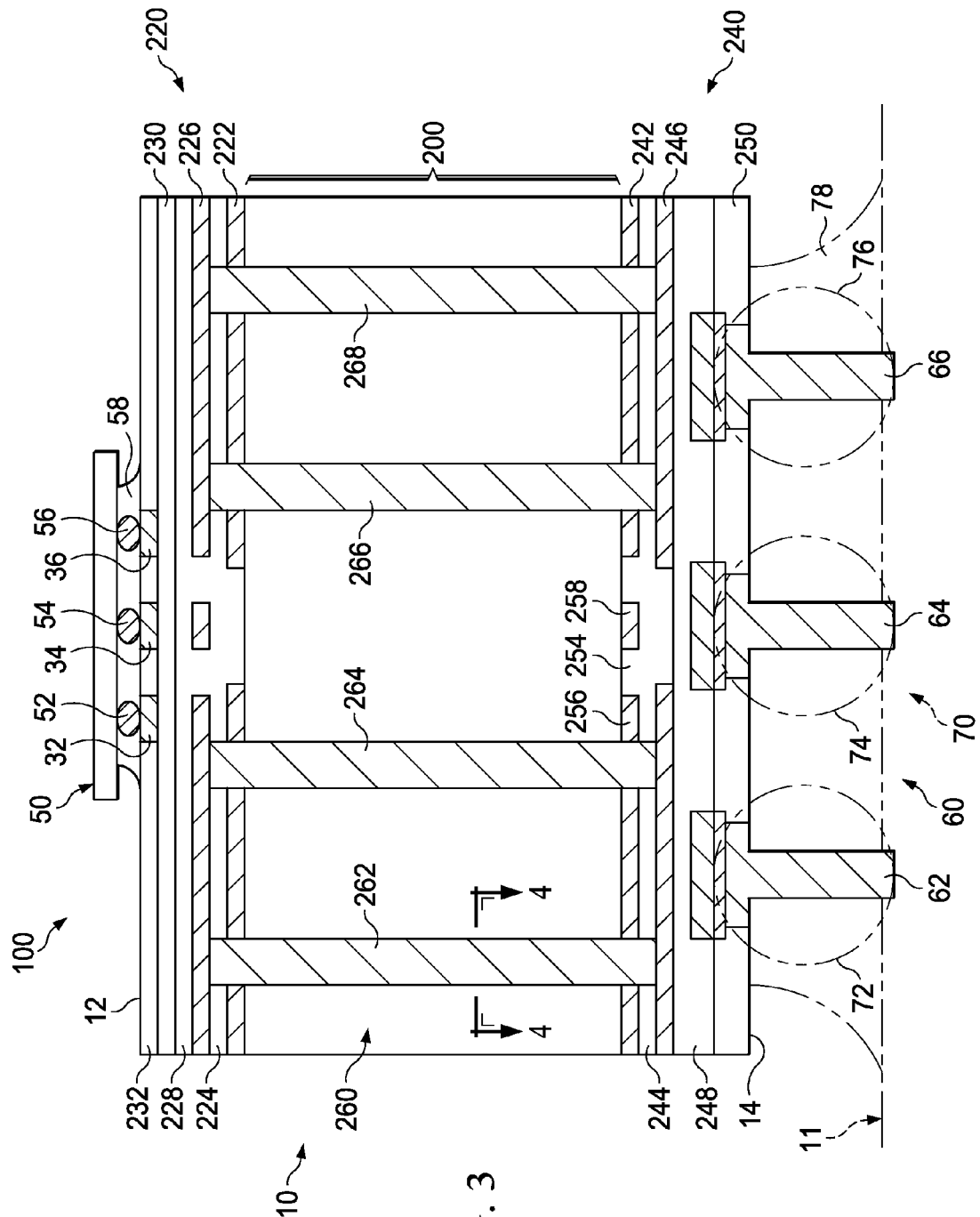
FIG. 3 is a cross-sectional elevation view taken along the line 3-3 of FIG. 2.

FIGS. 2 and 3 illustrate an integrated circuit package 100 formed by mounting a silicon die integrated circuit device 50 within the die mounting area 20 (FIG. 1) of the substrate 10. Specifically, with reference to FIG. 3, the circuit device 50 may be a flip chip and the substrate lands (e.g., the lands 32, 34, 36) may be electrically connected to corresponding interconnect pads (not shown) on the die 50 by solder bumps (e.g., the solder bumps 52, 54, 56, respectively). An underfill material 58 may also be provided between the die 50 and the substrate upper surface 12 in order to provide stability, in a conventional manner. With further reference to FIG. 3, the integrated circuit package 100 may also include a plurality of interconnect pins or tabs 60, including the individual interconnect tabs 62, 64, and 66, as shown. Interconnect tabs 60 may be provided to allow the integrated circuit package 100 to connect to other electronic circuitry, e.g., an underlying substrate. Other types of interconnect structure could be used instead of interconnect tabs 60. For example, the interconnect structure may be a ball grid array 70 having solder balls 72, 74, 76, etc. and underfill 78, as shown in phantom lines in FIG. 3. Thus, the integrated circuit package 100 serves to electrically connect the die 50 to external circuitry via the substrate 10. It is noted that, although not shown in the drawings, the integrated circuit package 10 may, if desired, include a lid covering the die 50. The use of lids is conventional and known in the art.

It is noted that the die 50 is illustrated as being a flip chip type device mounted to the underlying substrate 10 via solder bump interconnect technology. It is to be understood, however, that this specific configuration is illustrated for exemplary purposes only. The concepts described herein may readily be applied to other types of integrated circuit devices and mounting schemes, as will be appreciated by one skilled in the art.

As discussed previously, undesirable bending or warping in integrated circuit packages 100 can be caused by a difference in the coefficient of thermal expansion ("CTE") between the substrate (e.g., substrate 10, FIG. 1) and the attached semiconductor device, e.g. silicon die 50, FIG. 2). It has been found that most of this warping occurs during heating steps when the die is attached to the substrate (e.g., via a solder reflow process) and when underfill material is inserted between the die and the substrate and cured, in a manner as described above. Since the silicon die 50 and the substrate 10 have different coefficients of thermal expansion, heating and cooling results in different amounts of expansion and contraction of the two parts. As a result, bending or warping of one or both parts may occur and the underfill 58 may become delaminated from adjacent structure.

To address this problem, described herein are various processes for selectively controlling the CTE of an organic substrate 10, particularly at the die mounting area 22 of the substrate 10. More specifically, the substrate 10 may be altered, in a manner that will be described in further detail herein, in order to bring its CTE closer to that of the silicon die 50 and, thus, reduce the amount of CTE mismatch between the silicon die 50 and the substrate 10.

A first process for selectively controlling the CTE of an organic substrate will now be described in detail. With reference to FIG. 3, the substrate 10 may include a core 200, as shown. A first plurality of circuitry layers 220 may be located above the core 200 and a second plurality of circuitry layers 240 may be located below the core 200. The circuitry layers 220, 240 may be constructed of alternating layers of conductive and insulating material in a conventional manner in order to form the desired circuit configuration within the substrate 10. The first plurality of circuitry layers 220, for example, may include the generally parallel conductive layers 222, 226, and 230 and alternating insulating layers 224, 228, and 232. In a similar manner, the second plurality of circuitry layers 240 may include the generally parallel conductive layers 242, 246, and 250 and alternating insulating layers 244 and 248. As can be appreciated from FIG. 3, the material forming the insulating layers 224, 228, 232, 244, and 248 may also extend between portions of the conductive material within a conductive layer (as shown, for example, in FIG. 3, where a portion of insulating material 254 extends between portions 256, 258 of conductive material within the conductive layer 242). At least some of the conductive layers comprise electrical traces.

In conventional substrate construction, the conductive circuitry layers may, for example, be formed from a conductive copper foil material. Conventional insulating layers may be formed from an organic dielectric material such as epoxy.

With continued reference to FIG. 3, a plurality of plated through holes (PTHs) (sometimes referred to in the industry as "vias") 260, including the individual plated through holes 262, 264, 266, and 268, may extend within the substrate 10 transversely with respect to the circuitry layers 220, 240. Conventional substrates may include blind vias (i.e., holes that are exposed only on one side of the substrate) and buried vias (i.e., holes used to connect internal layers without being exposed on either surface of the substrate). Substrates may also sometimes include thermal vias which carry heat away from power devices and are typically used in arrays of about a dozen. It is noted that, for purposes of illustrative clarity, only blind vias are shown in FIG. 3. It is to be understood, however, that the substrate 10 may include other types of vias as well as those specifically illustrated in FIG. 3.

With further reference to FIG. 3, the plated through holes 260 may be provided in order to establish conductive paths between various conductive layers (e.g., the conductive layers 222, 226, 230, 242, 246, 250) within the substrate 10, in a conventional manner. FIG. 4 is a cross-sectional view of the PTH 262, taken along the line 4-4 in FIG. 3. With reference now to FIG. 4, the plated through hole 262 may include a generally circular outer perimeter 270 defined by a hole formed through the core 200 and through various circuitry layers of the substrate 10. A conductive layer 272 may be formed within the outer perimeter 270, as shown, and may extend for the entire length of the through hole. It is noted that the relative thickness of the conductive layer 272 is exaggerated in FIG. 4 for illustrative purposes. In actuality, the conductive layer 272 may be an extremely thin layer of material, applied, for example, by an electroplating process. Alternatively, the conductive layer 272 may be formed by lining the hole 270 with a tube or a rivet formed from a conductive material. A plugging material 274 may be located within the elongated hole 276 defined by the interior surface 273 of conductive layer 272 and may also extend for the entire length of the through hole. The plugging material 274 may be used to provide structural support to the conductive layer 272. In order for the plated through hole 262 to establish a desired conductive path within the substrate 10, selected conductive layers may be constructed so as to have continuity with conductive layer 272, in a conventional manner. Other plated through holes in the substrate 10 (e.g., the plated through holes 264, 266, 268) may be formed in a similar manner to that described above with respect to the plated through hole 262.

In conventional substrate construction, the plated through hole conductive layer may be formed by electrolytic plating and may have a thickness of about 12 μm. Conventional plated through hole plugging materials may, for example, be formed by stencil printing of organic based epoxy filled with silica.

The CTE mismatch between die 50 and substrate 10 manifests itself in expansion or contraction of the substrate 10 in the die mounting region 22 that does not match the expansion or contraction of the die 50 attached thereto during heating or cooling periods. As a result, the solder joints formed between the substrate and die by reflow of flip chip solder bumps (or other attachment structure for other types of die attachment) are put under stress and the substrate 10 may warp. The coupling of the die 50 to the substrate 10 during reflow heating of solder bumps 52, 54, 56 and the coupling of the die 50 and substrate 10 during underfill cure are the two heating/cooling cycles in a flip chip die package 100 that cause most of the problems. In a flip chip ball grid array package, the heating and cooling cycles associated with solder ball attachment add further heating and cooling cycles to the assembly. The modified structures described below causes the CTE of the substrate 10 at the die mounting area 22 to be closer to the CTE of the silicon die 50. This causes the difference in the amount of expansion or contraction of the substrate 10 and the die 50 during heating and cooling cycles to be smaller, resulting in less warping of the substrate 10 and thus a flatter substrate 10. The chance of underfill delamination and solder joint rupture is also reduced.

The disclosed structure causes the CTE of the substrate 10 at the die attach area 22 of the substrate 10 to more closely match the CTE of the die 50 resulting in less warpage and consequently a flatter substrate. One way of achieving this result is by the filling the plated through holes (PTHs) 264, 266 within the die mounting area 22 of the substrate 10 with a low CTE material (i.e. lower CTE than the organic plugging resin used in most current substrates. Examples of such lower CTE materials include molybdenum (commonly used in substrate manufacture processing), Cu paste (i.e. trade name ALIVH), carbon fiber, other low CTE alloys (Invar), metal composites and/or ceramic fillers or combination thereof that can be formed with the aforementioned materials to achieve a relatively low substrate CTE at the die mounting area 20. Because the die mounting area 20 is the substrate area where the CTE most needs to be controlled, the plated through holes 262, 268 outside the die mounting area 20 need not be filled with the same low CTE material as used to fill PTHs 264, 266. Thus a substrate 10 having PTHs 264, 266 in the die mounting area 20 filled with a lower CTE material than that used to fill the PTHs 262, 268 located outside the die mounting area 22 may be provided to reduce substrate warpage, etc. Such a structure may also reduce the risk of solder joint rupture.

The CTE mismatch between the die 50 and the substrate 10 may also be reduced by changing the material used in the conductive layers 222, 226, 230, 242, 246 and 250. In one such embodiment all of the conductive layers are formed from a conductive metal having a lower CTE than conventional layers, such as copper layers. In another embodiment not all of the conductor layers are formed from the same material. For example in one embodiment, the top conductor layer 230 and the bottom conductor layer 250 are both formed from a relatively low CTE conductor material such as nickel or molybdenum-copper and the remainder of the conductor layers 222, 226, 242, 246 are formed from a higher CTE material such as copper. In another embodiment only the bottom conductor layer 250 is formed from a relatively low CTE material and the remaining layers are formed from a higher CTE material such as copper. Applicants have discovered that, surprisingly, reducing the CTE of only the bottom conductor layer 250 has a greater effect on reducing warpage of the substrate 10 than reducing the CTE of only the top conductor layer 230.

Applicants have also discovered that reducing the CTE of insulating layers 224, 228, 232, 244, 248 can also lessen the CTE mismatch between the CTEs of the substrate 10 and the die 50. This may be done in a manner analogous to that described above with respect to the conductor layers. In one embodiment only the top and bottom insulating layers 232, 248 are formed from an insulating material, such as sold by AJINOMOTO Fine Techno Co., Inc. of Japan under the trade names ABF GX-T31 or GZ41 with a relatively lower CTE than that of conventional insulating material, such as sold by AJINOMOTO Fine Techno Co., Inc. of Japan under the trade names GX-13 or GX-3. Also, surprisingly, when only the bottom layer of insulating material 248 is constructed from a lower CTE material than the other insulating layers, the reduction in substrate warpage is greater than when only the top layer of insulating material 232 is constructed from the same lower CTE material than the other insulating layers.

Thus, three different methods of controlling substrate warpage and/or solder joint damage have been disclosed above. One method reduces the mismatch between the CTE of the substrate 10 and the die 50 by using PTH fill material having one CTE in PTHs such as 264 and 266 positioned below the die mounting area 22 and another fill material having a different CTE in PTHs such as 262, 268 positioned below a peripheral area 40 of the substrate 10 outside of area 22. A second method reduces the CTE mismatch between the substrate 10 and the die 50 by making the bottom and top conductive layers, e.g. layers 250 and 230 of a first conductor material with a first CTE and inner layers 222, 226, 242 and 246 from a second conductor material with a second CTE having a different CTE than the first. In one embodiment only the bottom conductor layer 250 is made from different materials than the other conductor layers. A third method reduces the CTE mismatch between the substrate 10 and the die 50 by making the bottom and top insulating layers, e.g. layers 248 and 232, from a first conductor material having a first CTE and inner layers 222, 226, 242 and 246 from a second conductor material having a second CTE that is different than the first. In one embodiment, only the bottom insulating layer 248 is made from material having a different CTE than the other insulating layers. Also, any of the methods mentioned above may be combined with any of the other methods to control CTE mismatch and thus reduce substrate 10 warpage and/or damage to the solder bonds between the die 50 and substrate 10. In the specifically described embodiments the CTE of the die 50 was lower than the CTE of the substrate 10. However, this same basic methodology can be used to control warpage, etc. if the CTE of the die is greater than the CTE of the substrate on which the die is mounted. In other words, the CTE mismatch of any two attached electrical substrates may be reduced by using the above described methods and structures.

The foregoing description of specific embodiments of a die and substrate assembly has been presented for purposes of illustration and description. The specific embodiments described are not intended to be exhaustive or to suggest a constraint to the precise forms disclosed, and many modifications and variations are possible in light of the above teaching. The illustrated embodiments were chosen and described in order to best explain principles and practical application, to thereby enable others skilled in the art to best utilize the various embodiments with various modifications as are suited to the particular use contemplated. It is intended that the language of the claims appended hereto be broadly construed so as to cover different embodiments of the structures and methods expressly disclosed here, except as limited by the prior art.

What is claimed is:

1. An integrated circuit (IC) package comprising:
   a substrate having a top surface with an IC die mounting area and a peripheral area surrounding said mounting area;
   a plurality of generally parallel conductor layers;
   a plurality of plated through holes (PTHs) extending through said conductor layers in a direction transverse to said conductor layers, said plurality of PTHs comprising a first portion of said plurality selectively positioned beneath said IC die mounting area and filled with a filler material having a first filler coefficient of thermal expansion (CTE) and a second portion of said plurality selectively positioned beneath said peripheral area and filled with a material having a second filler CTE different than said first filler CTE; and
   a die attached to said die mounting area.

2. The IC package of claim 1 wherein at least one of said conductor layers is formed from a first conductor material having a first conductor CTE and at least one of the conductor layers is formed from a second conductor material having a second conductor CTE different than said first conductor CTE.

3. The IC package of claim 2 wherein said substrate further comprises a plurality of insulating layers disposed between said plurality of parallel conductor layers, wherein at least one of said insulating layers is formed from a first insulating material having a first insulator CTE and at least one of the insulating layers is formed from a second insulating material having a second insulator CTE different than said first insulator CTE.

4. The IC package of claim 1 wherein said substrate further comprises a plurality of parallel insulating layers disposed between said plurality of generally parallel conductor layers, wherein at least one of said insulating layers is formed from a first insulating material having a first insulator CTE and at least one of the insulating layers is formed from a second insulating material having a second insulator CTE different than said first insulator CTE.

5. The IC package of claim 1 wherein said die is a flip chip die.

6. The IC package of claim 5 wherein said substrate has a ball grid array on one surface thereof.

7. The IC package of claim 2 wherein said die is a flip chip die.

8. The IC package of claim 7 wherein said substrate has a ball grid array on one surface thereof.

9. The IC package of claim 3 wherein said die is a flip chip die.

10. The IC package of claim 9 wherein said substrate has a ball grid array on one face surface thereof.

* * * * *